(12) United States Patent
Odnoblyudov

(10) Patent No.: US 9,634,187 B2
(45) Date of Patent: Apr. 25, 2017

(54) FLIP CHIP LIGHT EMITTING DIODE HAVING TRNSPARENT MATERIAL WITH SURFACE FEATURES

(71) Applicant: Bridgelux, Inc., Livermore, CA (US)

(72) Inventor: Vladimir A. Odnoblyudov, Danville, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 14/869,925

(22) Filed: Sep. 29, 2015

(65) Prior Publication Data

US 2016/0093768 A1 Mar. 31, 2016

Related U.S. Application Data

(60) Provisional application No. 62/057,170, filed on Sep. 29, 2014.

(51) Int. Cl.
| | |
|---|---|
| *H01L 33/00* | (2010.01) |
| *H01L 25/07* | (2006.01) |
| *H01L 33/22* | (2010.01) |
| *H01L 33/32* | (2010.01) |
| *H01L 33/38* | (2010.01) |
| *H01L 33/50* | (2010.01) |
| *H01L 33/62* | (2010.01) |

(Continued)

(52) U.S. Cl.
CPC .......... *H01L 33/22* (2013.01); *H01L 25/0753* (2013.01); *H01L 33/007* (2013.01); *H01L 33/20* (2013.01); *H01L 33/32* (2013.01); *H01L 33/38* (2013.01); *H01L 33/502* (2013.01); *H01L 33/508* (2013.01); *H01L 33/62* (2013.01); *H01L 2933/0016* (2013.01); *H01L 2933/0041* (2013.01)

(58) Field of Classification Search
CPC ....... H01L 33/22; H01L 33/007; H01L 33/32; H01L 33/38; H01L 33/502; H01L 33/62; H01L 25/0753; H01L 2933/0016; H01L 2933/0041
See application file for complete search history.

(56) References Cited

U.S. PATENT DOCUMENTS

| | | | | |
|---|---|---|---|---|
| 7,604,758 B2 * | 10/2009 | Akutsu | ................. | B29C 33/405 264/1.24 |
| 8,063,557 B2 * | 11/2011 | Hsieh | .................... | H01L 33/22 313/116 |

(Continued)

*Primary Examiner* — Ida M Soward
(74) *Attorney, Agent, or Firm* — Snell & Wilmer L.L.P.

(57) ABSTRACT

Flip chip LEDs include a transparent substrate or carrier having an active material attached thereto and having a number of electrodes disposed along a common surface of the active material. The substrate may include a number of surface features disposed along a first surface adjacent the active material for improving light extraction from the active material, and includes a number of surface features along a second surface opposite the first surface for minimizing internal reflection of light through the substrate, thereby improving light extraction from the transparent substrate. The surface features on both surfaces may be arranged having a random or ordered orientation relative to one another. A plurality of such flip chip LEDs may be physically packaged together in a manner providing electrical connection with the same for a lighting end-use application.

30 Claims, 3 Drawing Sheets

(51) Int. Cl.
*H01L 25/075* (2006.01)
*H01L 33/20* (2010.01)

(56) References Cited

U.S. PATENT DOCUMENTS

| | | | | |
|---|---|---|---|---|
| 8,587,007 | B2* | 11/2013 | Yoon | H01L 21/0237 257/103 |
| 2005/0156185 | A1* | 7/2005 | Kim | H01L 33/387 257/99 |
| 2005/0253161 | A1* | 11/2005 | Horio | H01L 33/08 257/100 |
| 2007/0085093 | A1* | 4/2007 | Ohmae | C30B 23/04 257/89 |
| 2008/0121903 | A1* | 5/2008 | Hiramatsu | H01L 21/0237 257/89 |
| 2009/0322990 | A1* | 12/2009 | Kawana | G02B 6/0073 349/68 |
| 2012/0040480 | A1* | 2/2012 | Shieh | H01L 33/38 438/26 |
| 2014/0197441 | A1* | 7/2014 | Ye | H01L 33/507 257/98 |
| 2014/0353707 | A1* | 12/2014 | Nakamura | H01L 33/22 257/98 |
| 2015/0349214 | A1* | 12/2015 | Meyer | H01L 33/08 257/98 |
| 2016/0301188 | A1* | 10/2016 | Mathai | H01S 5/18363 |

* cited by examiner

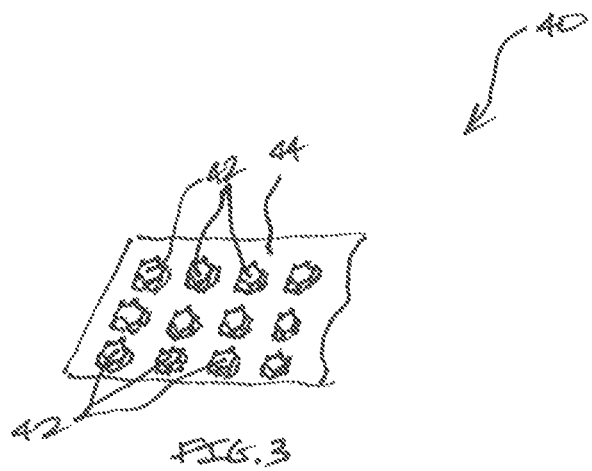
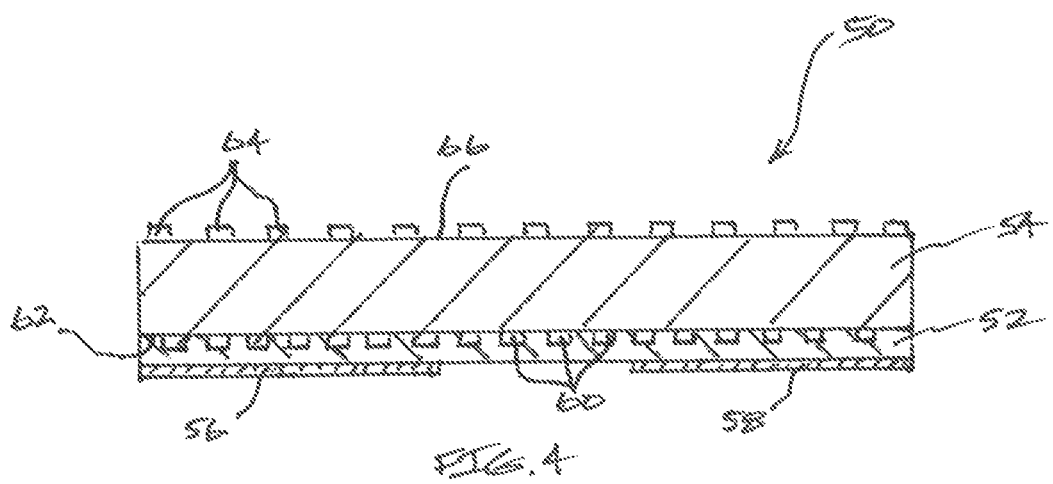

FLIP CHIP LIGHT EMITTING DIODE HAVING TRNSPARENT MATERIAL WITH SURFACE FEATURES

CROSS-REFERENCE TO RELATED APPLICATIONS

This patent application claims the benefit of U.S. Provisional Patent Application No. 62/057,170 filed on Sep. 29, 2014, which is hereby incorporated by reference in its entirety.

FIELD

Disclosed herein is a light emitting diode construction, light emitting diode packaging comprising the same, and methods for making the same.

BACKGROUND

Flip chip light emitting diodes (LEDs) and the use of the same in light emitting assemblies are known in the art. Such known flip chip LEDs are constructed making use of active materials known to produce light in a particular wavelength, e.g., a blue wavelength, when subjected to a power source to initiate current flow through the flip chip thereby causing the emission of light therefrom to meet the needs of a particular end-use application.

While such known flip chip LED constructions produce a certain level of light emission therefrom, it is desired that the amount of light extracted from such flip chip LED constructions be increased. It is, therefore, desired that flip chip LED constructions be developed in a manner that produces an improved degree of light extraction efficiency when compared to conventional flip chip LED constructions. It is further desired that such flip chip LED constructions be developed in a manner having an architecture that is the same as or similar to the architecture of other flip chip LEDs that may be used in an LED package to thereby simplify the assembly process and optical and thermal design, and to permit retrofitting into existing LED packages and assemblies.

BRIEF DESCRIPTION OF THE DRAWINGS

These and other features and advantages of light emitting diode constructions, assemblies comprising the same, and methods for making the same as disclosed herein will be appreciated as the same becomes better understood by reference to the following detailed description when considered in connection with the accompanying drawings.

FIG. 3 is a schematic view of a partial section of a substrate surface used to form the flip chip light emitting diode construction of FIG. 1;

FIG. 4 is a cross-sectional side view of an example flip chip light emitting diode construction;

SUMMARY

Figure 1:
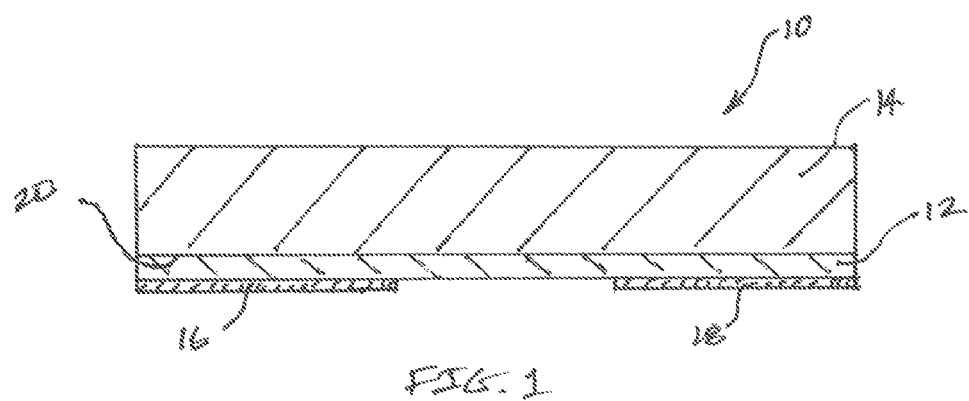
FIG. 1 is a cross-sectional side view of an example flip chip light emitting diode construction.

Flip chip LEDs as disclosed herein comprise a substrate or carrier formed from a rigid transparent material, and an active material bonded with a first surface of the transparent material. In an example, the transparent material is a substrate that the active material is epitaxially grown onto. In another example, the transparent material is a carrier that the active material is attached to after being grown onto a substrate material that is then removed. Electrodes are disposed on the flip chip LED adjacent the active material layer for connecting with electrical contacts of an adjacent connection member to power the flip chip LEDs.

The first surface may comprise a number of surface features configured to improve light extraction from the active layer. In an example, the surface features project outwardly from the first surface a depth into the active material, wherein the depth or distance of projection may be from about 0.5 to 10 micrometers. In an example, the surface features have wall surfaces oriented orthogonal to the first surface. In an example, the surface features have a hexagonal shape and may be positioned in a random or ordered arrangement relative to one another.

A second surface of the transparent material oriented opposite the first surface comprises a number of surface features for minimizing total internal reflection of light passing through the transparent material to the second surface, thereby improving light extraction from the transparent material. In an example, the surface features on the transparent material second surface project outwardly a distance therefrom, and are configured having wall surfaces oriented orthogonal to the second surface. In an example, the surface features on the transparent material second surface project a distance of from about 0.05 to 20 micrometers outwardly therefrom. The surface features on the transparent material second surface may be positioned in a random or ordered arrangement relative to one another.

Flip chip LEDs as disclosed herein may comprise a layer of wavelength conversion material disposed over the transparent material, e.g., in the form of conformal phosphor. In an example, the flip chip LED active material may be formed from GaN, and the transparent material may be sapphire that the GaN is epitaxially grown onto. In an example, the flip chip LED may have an aspect ratio, as measured between a linear dimension and a thickness of the flip chip LED, greater than about 4. A number of the flip chip LEDs as disclosed herein may be combined together to form a chip-on-board LED diode package configured to both mechanically accommodate the same and provide electrical connection therewith to power the flip chip LEDs for an end-use lighting application.

Flip chip LEDs as disclosed herein may be made by epitaxially growing one or more layers of active material onto a substrate. In an embodiment where the substrate is transparent, the substrate may remain in place, the electrodes may be formed along a common surface of the active material, and a surface of the substrate opposite the active material may be formed having a number of the surface features projecting outwardly therefrom to minimize internal reflection and improve light extraction from the substrate. The substrate may include surface features that project into active material to improve light extraction therefrom. The surface features projecting into the active material are preformed prior to forming the active material onto the substrate. The surface features projecting from the opposite substrate surface may be formed before or after the active material is grown onto the substrate. In another embodiment, the substrate that the active material is epitaxially grown on may not be transparent, in which case it is removed and a transparent carrier is attached in its place to the active material layer. The surface features in the carrier surface opposite the active material, to improve light extraction from the transparent carrier, may be formed before or after attaching the active material layer to the transparent carrier.

DESCRIPTION

Light emitting diodes (LEDs) as disclosed herein are specially constructed having a flip chip architecture to provide an improved degree of light extraction therefrom, and may be used with flip chip LEDs designed to emit light in different wavelengths including and not limited to blue, yellow, amber and/or red wavelengths. Such flip chip LEDs are characterized in having improved light extraction efficiency when compare to conventional flip chip LEDs, and the constructions of the same, methods for making the same and packaging such flip chip LEDs to provide an LED assembly/package capable of meeting the needs of end-use lighting applications are disclosed herein.

FIG. 1 illustrates a flip chip LED 10 constructed from active materials enabling it to emit light in a desired wavelength. In an example, the active materials may be selected produce light in a blue wavelength in the range of from about 400 to 500 nm, herein referred to as a blue flip chip LED. In an example, the blue flip chip LED comprises an active material 12 formed for example from GaN that has been grown, e.g., epitaxially grown, onto a rigid transparent substrate 14 such as one formed from sapphire or the like having a crystalline lattice structure that is compatible with the active material, e.g., GaN. The blue flip chip LED includes a pair of electrodes 16 and 18, e.g., P and N electrodes, disposed on one side of the LED 10, that each extend to different respective regions of the GaN active material 12, and that facilitate electrical connection of the blue flip chip LED by connecting with respective electrical contacts positioned opposite from and adjacent the blue flip chip LED, i.e., along one side of the blue flip chip LED.

Figure 2:
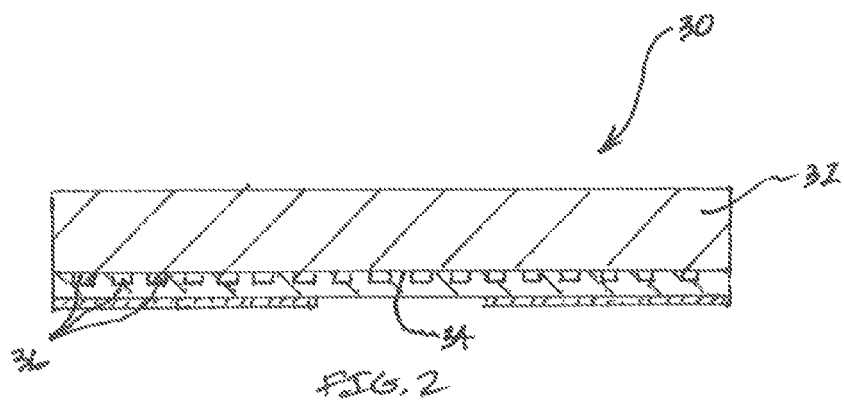
FIG. 2 is a cross-sectional side view of another example flip chip light emitting diode construction.

In the example illustrated in FIG. 1, the substrate 14 comprises a first surface 20 that interfaces with the active material 12, a substrate-active material interface surface 20, that is smooth and that does not include any surface features in the form or recesses or projections. FIG. 2 illustrates an example flip chip LED 30 similar to that illustrated in FIG. 1 except that the substrate 32 includes a substrate interface surface 34 that comprises a number of surface features 36, and in an example embodiment, such surface features are in the form of projections extending outwardly a distance away from the remaining substrate interface surface. In this example, the substrate 32 is intentionally formed prior to growing the active material thereon to have such surface features, and the surface features integral with the substrate, are configured and positioned on the substrate in a manner so as to increase the amount of light extracted from the active material and into the substrate during current flow between the electrodes. Additionally, the surface features may be configured to provide an improved degree of mechanical interface/epitaxial quality between the active material and the substrate, and helps to manage the dislocation layer of the active material. In an example, the surface features 36 are provide in the form of projections that are configured to promote light scattering from the active material layer and into the transparent substrate.

FIG. 3 illustrates a partial section of a transparent substrate 40 as used to form the flip chip LED of FIG. 2, comprising a plurality of surface features 42 in the form of projections extending outwardly a distance from the substrate-active material interface surface 44. In an example embodiment, it is desired that the projections 42 be configured to project orthogonally from the interface surface 44. The distance of projection can and will vary depending on the particular LED constructions and end-use application, and in an example embodiment project a distance of from about 0.5 to 10 micrometers. The projections can be configured having a number of differently angled side walls, and in example embodiment the projections are configured having six side wall surfaces, e.g., are provided having a hexagonal shape. The thickness between opposed wall structures of a given projection, e.g., in the example where the projection has a hexagonal shape, may be in the range of from about 1 to 10 micrometers. The projections are positioned along the substrate interface surface in a manner that may be equally-spaced relative to one another or randomly-spaced relative to one another. It is to be understood that the surface features 42 as disclosed herein may be sized and/or configured differently than the reference examples provided above depending on the particular scale of the LED construction and/or the end use LED application, and that all such differently sized and/or configured projections are intended to be within the scope of the concept as disclosed herein.

The projections may be formed into the substrate by etching, cutting, machining or other techniques known in the art. As noted above, a feature of such surface features is that they be configured in a manner that improves the degree of light extracted from the active material and into the transparent substrate.

While the flip chip LED constructions described above and illustrated in FIGS. 1 to 3, comprising a transparent substrate, have been ones described as having the active material grown, e.g., epitaxial growth, onto the substrate, it is to be understood that the term "substrate" as used above is intended to mean any type of transparent material to which an active material is attached thereto, whether grown onto or whether bonded or otherwise connected with the transparent material. For example, in some flip chip LED constructions the substrate material that is used for epitaxially growing the particular active material thereon may not be transparent so as to facilitate light transmission therethrough. In such flip chip LED construction, the substrate may be removed from the active material, and at some point in making the LED construction a transparent carrier material may be attached, e.g., bonded, to the existing active material (e.g., on a surface of the active material opposite from the substrate). For example, the flip chip may be a red flip chip that emits light in the 550 to 600 nanometer wavelength and that is epitaxially grown on a nontransparent substrate that is removed and wherein a transparent carrier material bonded to the active material payer to promote light emission therefrom. In such an example flip chip LED construction, the carrier material is considered to be an equivalent structure as the substrate in the context its features, e.g., surface projections, as described above and illustrated in FIGS. 1 to 3. Thus, it is to be understood that flip chip LED constructions as disclosed herein may comprise transparent substrates or transparent carriers configured as disclosed depending on the particular manner in which the flip chip LED is made.

FIG. 4 illustrates a flip chip LED construction 50 comprising the active material layer 52 attached with the transparent substrate or carrier 54, and comprising electrodes 56 and 58 connected with respective areas of the active material layer 52 and positioned along a common surface of the construction 50. In this example, the transparent substrate or carrier 54 comprises a number of surface features 60 in the form of projections extending outwardly away from a substrate or carrier-active material interface surface 62 as described above to improve the light extraction from the active material layer. The transparent substrate or carrier 54 is further configured to comprise a number of surface features 64 disposed along a substrate second or outer surface 66, i.e., a surface opposite from the active material interface surface 62. In an example embodiment, the surface features 64 are configured in a manner so as to reduce or minimize the total internal reflection (TIR) of light passing through the transparent substrate or carrier outer surface 66 for the purpose of increasing the amount of light emitted from the flip chip LED construction, thus increasing light extraction efficiency.

In an example, the transparent substrate or carrier outer surface 66 comprises a number of surface features 64 in that are configured in the form of projections that are integral with the substrate and that extend a distance outwardly from the outer surface 66. The projections are configured in a manner that facilitates light that is passing internally within the transparent substrate or carrier to the upper surface to be scattered an emitted through the outer surface and not be internally reflected back into the transparent substrate. In an example, the projections are configured having sidewall surfaces that are orthogonal to the outer surface 66, and that may project outwardly a depth of from about 0.05 to 20 micrometers. The projections 64 may be configured having a number of different sidewall surfaces as useful to provide the desired light scattering effect. In an example, the projections 64 are configured having six sidewall surfaces or having a hexagonal shape. In an example, where the projections are configured having a hexagonal shape, the thickness between opposed wall surfaces may be from about 1 to 20 micrometers.

The projections 64 may be positioned along the substrate outer surface 66 in a manner that may be equally-spaced relative to one another or randomly-spaced relative to one another. In an example, the surface features 64 may be formed in the substrate outer surface 66 by etching, cutting, machining or other techniques, and such process may be performed on a wafer level before the wafer is diced into individual die. In an example, the substrate may be ran through a patterned process (e.g., when the substrate is sapphire, through a patterned sapphire process) once the process of forming the wafer is complete.

It is to be understood that the surface features 64 as disclosed herein may be sized and/or configured differently than the reference examples provided above depending on the particular scale of the LED construction and/or the end use LED application, and that all such differently sized and/or configured projections are intended to be within the scope of the concept as disclosed herein.

While the flip chip LED construction 50 described above and as illustrated in FIG. 4 is one comprising a transparent substrate or carrier 54 comprising a number of surface features 60 extending along the active material interface surface 62, it is to be understood that flip chip LED constructions as disclosed herein may not necessarily comprise such surface features 60 while still comprising the surface features 64 along the transparent substrate or carrier outer surface 66, and that such flip chip LED constructions are intended to be within the scope of the embodiments as disclosed herein.

The particular configuration, placement position, and/or size of the surface features 64 along the transparent substrate or carrier outer surface 66 may depend on the size of the flip chip LCD construction. For example, large flip chip LEDs, e.g., having a size of say 1 mm or larger, are known to have a light extraction efficiency that is less that than of relatively smaller flip chip LEDs, e.g., having a size of say 300 micrometers, largely as a result of the reduced light extraction through the side walls of the relatively smaller flip chip LEDs. Accordingly, while not wanting to be limited to any particular application, flip chip LED constructions as disclosed herein may operate to provide a larger improvement in light extraction efficiency in the larger flip chips as described above.

Further, the aspect ratio of the flip chip LED may also have an impact on the degree of light extraction efficiency that can be obtained from the flip chip constructions as disclosed herein, i.e., comprising the surface features 64 along the transparent substrate or carrier outer surface 66. For example, it has been observed that with flip chip LEDs having an aspect ratio (as measured by between the flip chip LED linear dimension and thickness or height) of greater than about 4 that improvements in light extraction of about 5 percent may be obtained.

Figure 5:
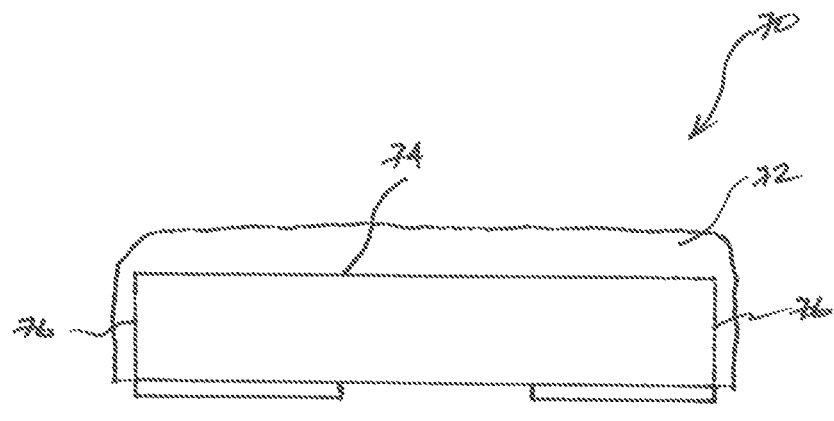
FIG. 5 is a schematic view of a substrate surface used to form the flip chip light emitting diode construction of FIG. 4.

FIG. 5 illustrates an example flip chip LED construction 70, as described above with reference to FIG. 5, further comprising a layer of wavelength conversion material 72 disposed thereon over the transparent substrate or carrier outer surface 74 and over side surfaces 76. In an example, the wavelength conversion material can be one capable of converting the wavelength of light emitted from the flip chip LED construction to a desired wavelength. In an example, the wavelength conversion material is phosphor, such as conformal phosphor.

A feature of flip chip LED constructions as disclosed herein having improved light extraction efficiency is that it because more light is now being extracted from the substrate or carrier outer surface 74 one may use a thinner layer of phosphor on the side surfaces 76 and achieve an overall light emission that is less blue (e.g., when the flip chip LED is one emitting 400 to 500 nanometer wavelength light), thereby resulting in less blue leakage. Before, blue wavelength light emission from the side surfaces created an issue of blue leakage that was addressed by using a thicker layer of phosphor thereover to produce the desired wavelength of light emitted from the LED. The improved amount of light emitted from the outer surface of flip chip LEDs as disclosed herein, once coated with phosphor, operates to reduce the relative impact of the side surface light emission so it can be addressed with a relatively thinner layer of phosphor, thereby providing an LED construction having an improved level of control over the wavelength of light emitted, while also reducing material costs.

While the use of phosphor as disclose above has been disclosed in the context of an example flip chip LED construction comprising blue flip chips, is it to be understood that the use of phosphor may extend flip chip LED constructions made according to the concepts disclosed herein that emit light in wavelengths other than blue, in which case the amount of the yellow constituent in the phosphor may be adjusted to provide the desired wavelength of light emitted from the flip chip LED construction.

Figure 6:
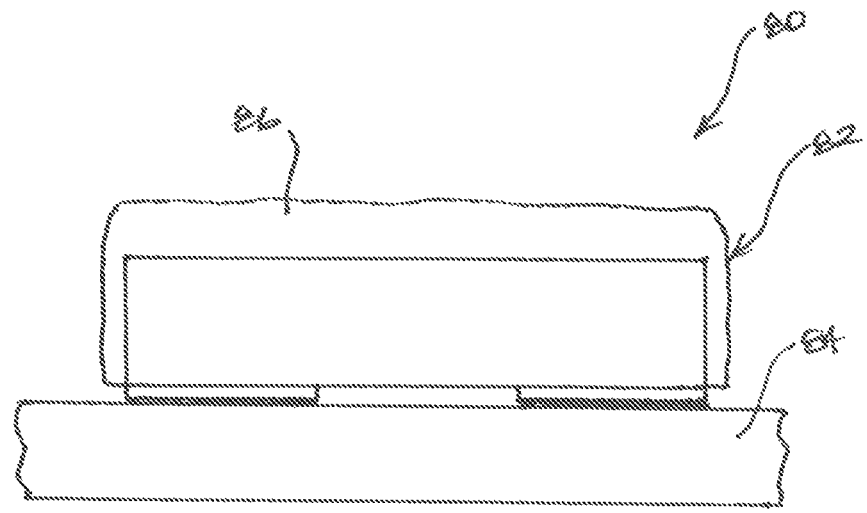
FIG. 6 is a schematic side view of an example light emitting assembly/package comprising flip chip emitting diodes as disclosed herein.

FIG. 6 schematically illustrates a construction, package, or assembly 80 comprising a flip chip LED construction 82 as disclosed herein and as disposed on a member 84. The flip chip blue flip chip LED construction 80 comprises phosphor 86 disposed thereover as described above with reference to FIG. 5. The member 84 is configured to accommodate electrical connection with the electrodes of the flip chip LED construction. While the assembly 80 illustrated in FIG. 6 comprises a single flip Chip LED construction for purposes of reference, it is to be understood within the scope of the concept as disclosed herein that the assembly may comprise a plurality of the flip chip LED constructions as disclosed herein that are each disposed on the member and that each have respective electrodes in electrical connected therewith to permit powering the plurality of flip chip LED constructions, wherein such assembly is configured for a desired end-use lighting application.

Flip chip LED constructions, packaging and/or assemblies comprising the same, and methods of making as disclosed are specifically design to provide an increased degree of light extraction when compared to conventional flip chip LEDs, thereby increasing light extraction efficiency of LED constructions and assembles comprising the same to better and more effectively meet the needs of LED end-use lighting applications, and further doing so in manner that permits use with LED assemblies already configured to accommodate such flip chip LED architecture, such as chip-on board LED packaging or the like.

Although certain specific embodiments of flip chip LED constructions have been described and illustrated for purposes or reference, it is to be understood that the disclosure and illustrations as provided herein not limited to the specific embodiments. Accordingly, various modifications, adaptations, and combinations of various features of the described embodiments can be practiced without departing from the scope what has been disposed herein including the appended claims.

What is claimed is:

1. A flip chip light emitting diode:
   an active material bonded with a first surface of a rigid transparent material; and
   electrodes disposed on the flip chip adjacent the active material for connecting with electrical contacts of an adjacent connection member;
   wherein a second surface of the rigid transparent material opposite the first surface comprises a number of surface features for improving light extraction from the rigid transparent material.

2. The flip chip light emitting diode as recited in claim 1 wherein the rigid transparent material is a substrate that the active material is grown on, and wherein the first surface comprises a number of surface features to improve light extraction from the active material.

3. The flip chip light emitting diode as recited in claim 2 wherein the surface features on the substrate first surface project outwardly a distance from the remaining portion of the first surface and are encapsulated by the active material.

4. The flip chip light emitting diode as recited in claim 3 wherein the surface features on the substrate first surface project a distance of from about 0.5 to 10 micrometers from the remaining portion of the first surface.

5. The flip chip light emitting diode as recited in claim 3 wherein the surface features on the substrate first surface have an hexagonal shape and are provided in a pattern.

6. The flip chip light emitting diode as recited in claim 1 wherein the surface features on the rigid transparent material second surface project outwardly a distance from the remaining portion of the second surface.

7. The flip chip light emitting diode as recited in claim 6 wherein the surface features on the rigid transparent material second surface are configured to minimize a total internal reflection of light passing through the rigid transparent material to the second surface.

8. The flip chip light emitting diode as recited in claim 6 wherein the surface features on the rigid transparent material second surface project a distance of from about 0.05 to 20 micrometers from the remaining portion of the second surface.

9. The flip chip light emitting diode as recited in claim 1 wherein the surface features on the rigid transparent material second surface are positioned in a pattern.

10. The flip chip light emitting diode as recited in claim 1 wherein the rigid transparent material is a substrate that the active material is grown on, the first surface comprises a number of surface features projecting outwardly therefrom to improve light extraction from the active material, and wherein the surface features on the substrate second surface project outwardly a distance therefrom that is the same or different than that of the surface features on the substrate first surface.

11. The flip chip light emitting diode as recited in claim 1 comprising a layer of wavelength conversion material disposed over the transparent material.

12. The flip chip light emitting diode as recited in claim 1 having an aspect ratio as measured between a linear dimension and a thickness of the flip chip light emitting diode of greater than about 4.

13. A chip-on-board light emitting diode package comprising a plurality of the flip chip light emitting diodes of claim 1.

14. The flip chip light emitting diode as recited in claim 1 wherein the active material is GaN, and the rigid transparent material is sapphire that the GaN is grown on.

15. A chip-on-board light emitting diode package comprising a number of flip chip light emitting diodes positioned adjacent one another, wherein the flip chip light emitting diode each comprises a pair of electrodes oriented along a common surface for electrical connection, wherein at least one flip chip light emitting diode comprises an active material attached to a first surface of a rigid transparent material, wherein the rigid transparent material includes a second surface that is opposite the first surface and that comprises a number of surface features thereon for minimizing a total internal reflection of light emitted by the active material and passing through the rigid transparent material to the second surface.

16. The chip-on-board light emitting package as recited in claim 15 wherein the surface features project outwardly a distance from the first surface and are arranged in a pattern.

17. The chip-on-board light emitting package as recited in claim 15 wherein the rigid transparent material first surface comprises a number of surface features for increasing extraction of light emitted by the active material.

18. The chip-on-board light emitting package as recited in claim 17 wherein the surface features of the rigid transparent material first surface project outwardly a distance therefrom of from about 0.5 to 10 micrometers.

19. The chip-on-board light emitting package as recited in claim 18 wherein the active material is GaN and the transparent material is sapphire.

20. The chip-on-board light emitting package as recited in claim 17, wherein the flip chip light emitting diode comprising the rigid transparent material is constructed to emit light in a wavelength of from about 400 to 500 nm or from about 550 to 600 nm.

21. The chip-on-board light emitting package as recited in claim 17 further comprising a phosphor material disposed over the rigid transparent material.

22. A flip chip light emitting diode:
an active material attached along a first surface of a transparent material layer, the first surface comprising a plurality of surface features projecting outwardly a partial depth into the active material and configured to increase the amount of light passed from the active material to the transparent material layer; and
electrodes disposed adjacent the active material and connected with different regions of the active material, the electrodes being configured for connecting with electrical contacts of an adjacent connection member; and
wherein the transparent material layer comprises a second surface opposite the first surface, wherein the second surface comprises a plurality of surface features projecting outwardly a distance therefrom.

23. The flip chip light emitting diode as recited in claim 22 wherein the transparent material layer second surface surface features project outwardly a distance therefrom of from about 0.5 to 20 micrometers, and wherein the surface features along the first surface project outwardly therefrom about 0.5 to 10 micrometers.

24. The flip chip light emitting diode as recited in claim 22 wherein the surface features projecting outwardly from the second surface comprise side surfaces that are orthogonal to a remaining portion of the second surface.

25. The flip chip light emitting diode as recited in claim 22 wherein one or both of the plurality of surface projections along the first and second surfaces of the transparent material layer are integral with the transparent material layer.

26. The flip chip light emitting diode as recited in claim 22 wherein the active material is GaN and the transparent material layer is sapphire that the GaN is grown on.

27. The flip chip light emitting diode as recited in claim 22 wherein the flip chip light emitting diode has an aspect ratio as measured between a thickness and a linear dimension of the flip chip light emitting diode of greater than about 4.

28. The flip chip light emitting diode as recited in claim 22 further comprising a layer of wavelength conversion material disposed over one or both of the transparent material layer second surface and side surfaces of the transparent material layer between the first and second surfaces.

29. The flip chip light emitting diode as recited in claim 22 constructed to emit light in a wavelength of from about 400 to 500 nm or from about 550 to 600 nm.

30. A chip-on-board light emitting diode package comprising a plurality of the flip chip light emitting diodes of claim 22.

* * * * *